United States Patent [19]
Takahashi

[11] Patent Number: 5,960,023
[45] Date of Patent: Sep. 28, 1999

[54] DISTRIBUTED FEEDBACK SEMICONDUCTOR LASER DIODE, METHOD FOR PRODUCING THE SAME, AND EXPOSURE METHOD THEREFOR

[75] Inventor: Koji Takahashi, Tenri, Japan

[73] Assignee: Sharp Kabushiki Kaisha, Osaka, Japan

[21] Appl. No.: 08/833,983

[22] Filed: Apr. 11, 1997

[30] Foreign Application Priority Data

Apr. 15, 1996 [JP] Japan ................................ 8-092854

[51] Int. Cl.$^6$ .................................................. H01S 3/08
[52] U.S. Cl. ............................ 372/96; 372/92; 372/46; 372/45
[58] Field of Search ............................ 372/45, 46, 96, 372/92

[56] References Cited

U.S. PATENT DOCUMENTS

| | | | |
|---|---|---|---|
| 5,020,072 | 5/1991 | Abe et al. | 372/96 |
| 5,093,835 | 3/1992 | Takemoto et al. | 372/45 |
| 5,253,262 | 10/1993 | Kurobe et al. | 372/45 |
| 5,347,533 | 9/1994 | Higashi et al. | 372/96 |
| 5,363,399 | 11/1994 | Yagi | 372/96 |
| 5,392,311 | 2/1995 | Makuta | 372/96 |

FOREIGN PATENT DOCUMENTS

| | | |
|---|---|---|
| 4-155987 | 5/1992 | Japan . |
| 5-29705 | 2/1993 | Japan . |
| 6-7624 | 1/1994 | Japan . |

OTHER PUBLICATIONS

H. Kogelnik et al., "Coupled–Wave Theory for Thick Hologram Gratings" *The Bell System Technical Journal* (1969) 48:2909–2947 (Nov.).

H. Kogelnik et al., "Coupled–Wave Theory of Distributed Feedback Lasers" *J. Appl. Phys.* (1972) 43(5):2327–2335. (May).

M. Okai et al., *The Extended Abstracts of the Spring Convention of the Japanese Society of Applied Physics* (1994). Partial Translation enclosed. Two pages total. (No month available).

*Primary Examiner*—Rodney Bovernick
*Assistant Examiner*—Yisun Song
*Attorney, Agent, or Firm*—Morrison & Foerster LLP

[57] ABSTRACT

A distributed feedback semiconductor laser diode includes an active layer for generating stimulated emission light and also includes a diffraction grating. The diffraction grating serves as a structure for providing a refractive index distribution and a gain distribution where the refractive index and the gain for the stimulated emission light exhibit a periodical change at an identical single period in the guiding direction of the stimulated emission light. A distributed feedback based on refractive index coupling and a distributed feedback based on gain coupling coexist in the distributed feedback semiconductor laser diode. The diffraction grating includes a phase discontinuous section where a phase of the periodical change of the refractive index and the gain is discontinuous. The phase discontinuous section is configured so that the phase shifts are within a range greater than 0 [rad] but less than π [rad], or within a range greater than π [rad] but less than 2π [rad].

16 Claims, 10 Drawing Sheets

Periodical change of a refractive index along line A-A':

H − L − H − L − H − L − H − L −

Periodical change of a refractive index along line B-B':

L − H − L − H − L − H − L − H −

DISTRIBUTED FEEDBACK SEMICONDUCTOR LASER DIODE, METHOD FOR PRODUCING THE SAME, AND EXPOSURE METHOD THEREFOR

BACKGROUND OF THE INVENTION

1. Field of the Invention

The present invention relates to a distributed feedback semiconductor laser diode (referred to also as a "DFB-LD", hereinafter) which realizes laser oscillation with a single wavelength. In particular, the present invention relates to a gain-coupled distributed feedback semiconductor laser diode (Gain-Coupled DFB-LD) which has a mechanism for providing a distributed feedback of light by a periodical distribution of gain.

2. Description of the Related Art

A distributed feedback semiconductor laser diode (DFB-LD) having an active layer for generating stimulated emission light includes a device structure where the refractive index, the gain, etc., for the stimulated emission light are periodically changed in the guiding direction of the stimulated emission light. In such a DFB-LD, the stimulated emission light is subject to an optical distributed feedback by the periodical change of the refractive index, the gain, etc., and laser oscillation is thereby obtained with a single wavelength.

A DFB-LD in which the distributed feedback is provided by the periodical change of refractive index (i.e., refractive index coupling) is called an index-coupled DFB-LD (referred to also as an "IC-DFB-LD", hereinafter). On the other hand, a DFB-LD in which the distributed feedback is provided by the periodical change of gain (i.e., gain coupling) is called a gain-coupled DFB-LD (referred to also as a "GC-DFB-LD", hereinafter). The IC-DFB-LD and the GC-DFB-LD are distinguished from each other.

Laser oscillation with a single wavelength can be obtained much more easily in the GC-DFB-LD than in the IC-DFB-LD, as shown in, for example, Journal of Applied Physics, vol. 43, page 2327 (1972). Moreover, the GC-DFB-LD has excellent characteristics which are practically important and which are not found in the IC-DFB-LD, such that a noise is not generated even when intense returning light is present. Furthermore, the setting of the reflectivity of the emission end face of a semiconductor laser diode is important for increasing the output and the efficiency of the semiconductor laser diode. In this regard, the reflectivity of the emission end face must be made substantially zero in the IC-DFB-LD, whereas it can be set to an arbitrary value in the GC-DFB-LD. Thus, the GC-DFB-LD has a great freedom in setting the end face reflectivity, and therefore is advantageous in optimizing device structures of semiconductor laser diodes.

With these various excellent characteristics, the GC-DFB-LD is very useful in practice as a single-wavelength light source for optical instruments, high speed optical transmission apparatuses, optical recording apparatuses, etc.

In order to realize such a GC-DFB-LD, it is necessary to incorporate in a semiconductor laser diode a structure for periodically changing the gain. For this purpose, two methods are generally employed.

One method is to form a structure in which the shape and properties of an active layer as well as a density of a current to be injected into the active layer are periodically changed (i.e., a gain-based diffraction grating) in a semiconductor laser diode. In this way, the active layer itself is provided with a periodical change of gain. The other method is to form a structure in which light-absorbing regions are periodically provided in the vicinity of an active layer which generates a uniform gain (i.e., a absorption-based diffraction grating). Due to such a structure, a periodical change of gain is effectively provided.

The basic structure for implementing the second method is disclosed in, for example, Japanese Patent Publication No. 6-7624. Hereinafter, the structure disclosed in this publication will be described with reference to FIG. 9.

FIG. 9 is a perspective view showing a structure of a GC-DFB-LD 900 disclosed in the above publication.

The GC-DFB-LD 900 has an un-AlGaAs (undoped-AlGaAs) active layer 905 for generating stimulated emission light. In the vicinity of the active layer 905, light-absorbing regions are provided periodically along the guiding direction of the stimulated emission light. Thus, the periodical change of gain is effectively provided in the device structure.

More particularly, in the GC-DFB-LD 900, an n-GaAs current confinement layer 902 including a stripe-shaped opening 902a is formed on a p-GaAs substrate 901. A p-AlGaAs cladding layer 904 is formed so as to cover the current confinement layer 902 and a portion of the surface of the substrate 901 which is exposed through the opening 902a. The opening 902a of the current confinement layer 902 serves as a current confinement groove 903.

The un-AlGaAs active layer 905 is formed on the cladding layer 904. An n-GaAs light absorbing layer 907 is formed on the active layer 905 via an n-AlGaAs buffer layer 906. The thickness of the light absorbing layer 907 is periodically changed (i.e., uneven) along the longitudinal direction of the stripe-shaped opening 902a.

An n-AlGaAs cladding layer 908 with a flat top surface is formed on the light absorbing layer 907. The surface of the cladding layer 908 is covered by an n-GaAs cap layer 909. An n-electrode 910b is formed on the surface of the n-GaAs cap layer 909. On the other hand, a p-electrode 910a is formed on the bottom surface of the p-GaAs substrate 901.

Next, a method for producing the GC-DFB-LD 900 having such a structure will be described.

First, the n-GaAs current confinement layer 902 is grown on the p-GaAs substrate 901 by using a liquid phase epitaxy method. Then, the current confinement layer 902 and a surface region of the substrate 901 are selectively etched so as to form the current confinement groove 903.

Next, the p-AlGaAs cladding layer 904 is grown by using the liquid phase epitaxy method so as to entirely cover the upper surfaces of the current confinement layer 902 and the current confinement groove 903. Herein, the upper surface of the formed cladding layer 904 is formed to be flat. Subsequently, the un-AlGaAs active layer 905, the n-AlGaAs buffer layer 906 and the n-GaAs light absorbing layer 907 are grown in this order by using the liquid phase epitaxy method.

Then, the light absorbing layer 907 is selectively etched by using a dual light beam interference exposure method and a wet etching so as to form a diffraction grating with a pitch of about 240 nm in the surface of the light absorbing layer 907.

Next, the n-AlGaAs cladding layer 908 and the n-GaAs cap layer 909 are grown in this order on the light absorbing layer 907. Then, the p-electrode 910a and the n-electrode 910b are formed on the bottom surface of the substrate 901 and on the upper surface of the cap layer 909, respectively. In this way, the GC-DFB-LD 900 is produced.

In the GC-DFB-LD 900 having such a structure, an effective periodical change occurs in the gain of the stimulated emission light generated in the active layer 905 due to the light absorbing layer 907 including the diffraction grating. Therefore, gain coupling of the stimulated emission light occurs and laser oscillation with a single wavelength is thereby obtained.

However, in the GC-DFB-LD 900, the refractive index differs between the GaAs light absorbing layer 907 and the AlGaAs cladding layer 908. Therefore, while there occurs the intended gain coupling, there also occurs undesirable refractive index coupling of the stimulated emission light due to the periodical change of refractive index. As a result, the excellent laser oscillation characteristics based on the gain coupling are deteriorated.

When the refractive index coupling and the gain coupling of stimulated emission light coexist in a DFB-LD, as in the aforementioned GC-DFB-LD 900, such a DFB-LD is called a "partial GC-DFB-LD". On the other hand, when a distributed feedback of stimulated emission light is provided exclusively based on the gain coupling, such a GC-DFB-LD is called a "pure GC-DFB-LD". These two GC-DFB-LDs are distinguished from each other.

Japanese Laid-Open Patent Publication No. 5-29705 discloses a distributed feedback semiconductor laser diode which is made in view of solving the above-described problem, i.e., the deterioration of the excellent laser oscillation characteristics to be obtained through the gain coupling because of the coexistence of the gain coupling and the refractive index coupling in a GC-DFB-LD.

In the distributed feedback semiconductor laser diode described in this publication, a structure for cancelling out the periodical change of refractive index is introduced. More specifically, an absorption-based diffraction grating having a structure as shown in FIG. 10A is formed in the vicinity of an active layer.

This structure includes a lower transparent layer 13 which is transparent for stimulated emission light generated in the active layer. A light absorbing layer 11 is formed on the lower transparent layer 13 in a periodical manner at constant pitches along the guiding direction as shown in the figure. Grooves 13a are provided in the surface of the transparent layer 13 at positions between adjacent portions of the light absorbing layer 11. An upper transparent layer 12, which is also transparent for the stimulated emission light, is formed so as to cover the light absorbing layer 11 and the grooves 13a in the lower transparent layer 13.

In this structure, the refractive index of the upper transparent layer 12 is set to be greater than that of the lower transparent layer 13, while the refractive index of the light absorbing layer 11 is set to be greater than that of the upper transparent layer 12. More particularly, FIG. 10B shows the periodical changes of refractive index along line A-A' and line B-B' of FIG. 10A. As shown in FIG. 10B, the refractive index change along line A-A' is: high (H)—low (L)—high (H)—. . . , whereas the change along line B-B' is: low (L)—high (H)—low (L)—. . . ; in other words, the periodical change of the magnitude of refractive index is opposite between line A-A' and line B-B'.

In the description hereinafter, the period of the refractive index change and the period of the gain change are referred to also as the "phase of a periodical change of refractive index" and the "phase of a periodical change of gain", respectively. Accordingly, when the refractive index and the gain correspondingly change between a high value and a low value (i.e., a gain is high where a refractive index is high), such a situation will be described also as "the phase of the periodical change of refractive index matches the phase of the periodical change of gain" or "they have the same phases with each other". When the refractive index and the gain oppositely change between a high value and a low value (i.e., a gain is low where a refractive index is high), such a situation will be described also as "the phase of the periodical change of refractive index is opposite to the phase of the periodical change of gain" or "they have the opposite phases with each other".

When the profile of the interface between the light absorbing layer 11 and the upper transparent layer 12 as well as the profile of the interface between the upper and lower transparent layers 12 and 13 are respectively precisely adjusted, an absorption-based diffraction grating is realized. In the absorption-based diffraction grating, the periodical change of refractive index is cancelled out as a whole. Consequently, a structure of the pure GC-DFB-LD, in which a distributed feedback is provided purely based on the gain coupling, can be obtained.

Moreover, in a semiconductor laser diode disclosed in Japanese Laid-Open Patent Publication No. 4-155987, the structure for cancelling out the periodical change of refractive index in the absorption-based diffraction grating is utilized in a gain-based diffraction grating. This semiconductor laser diode includes a gain-based diffraction grating in which the periodical change of refractive index is cancelled out by providing regions having the opposite phases of periodical change of refractive so as to adjoin each other.

However, the above-described conventional DFB-LD structures have the following disadvantages.

The device structure of the conventional partial GC-DFB-LD realizes a much higher yield of device structures realizing laser oscillation with a single wavelength, as compared to the device structure of the IC-DFB-LD. However, when stimulated emission light is directly modulated at a high speed in this device structure, there occurs a discontinuous shift (mode hopping) of wavelength and simultaneous oscillation of a plurality of wavelengths (multi-mode oscillation). This has been a drawback to application of this device structure.

In the case of the conventional pure GC-DFB-LD where the periodical change of refractive index is cancelled out, even a slight shift in the shape, depth, etc. of diffraction grating causes a great imbalance between the previously explained periodical changes of refractive index along line A-A' and line B-B' (see FIGS. 10A and 10B). In such a case, it is difficult to completely cancel the periodical change of refractive index. Thus, in order to provide a structure which cancels out the periodical change of refractive index in a satisfactory manner, a highly precise processing accuracy and reproducibility are required. However, it is extremely difficult to produce such a structure.

For example, the diffraction grating for a DFB-LD requires a large number of extremely small gratings (i.e., convex/concave portions) with a pitch of about 100 nm to 400 nm. Generally, it is very difficult to form such a large number of convex/concave portions while controlling various processing conditions so that the produced convex/concave portions are in the intended shape.

Therefore, with the pure GC-DFB-LD produced by the conventional techniques, it is practically impossible to completely cancel out the adverse affect of the refractive index coupling on a distributed feedback of stimulated emission light. As a result, the produced semiconductor laser diode operates as a partial GC-DFB-LD. Thus, it is nearly impossible with the conventional techniques to practically produce a desirable pure GC-DFB-LD.

SUMMARY OF THE INVENTION

The distributed feedback semiconductor laser diode of the present invention includes: an active layer for generating stimulated emission light; and a laser device structure having a refractive index distribution and a gain distribution where a refractive index and a gain for the stimulated emission light each exhibit a periodical change at an identical single period in a guiding direction of the stimulated emission light. The laser device structure is configured so that the stimulated emission light is subject to an optical distributed feedback due to the periodical changes of the refractive index and the gain, thereby realizing laser oscillation. The laser device structure includes a phase discontinuous section where a phase of the periodical change of the refractive index and the gain is discontinuous, a phase shift at the phase discontinuous section being within a range greater than 0 [rad] but less than $\pi$ [rad], or within a range greater than $\pi$ [rad] but less than $2\pi$ [rad].

According to another aspect of the present invention, a distributed feedback semiconductor laser diode includes: an active layer for generating stimulated emission light; and a laser device structure having a refractive index distribution and a gain distribution where a refractive index and a gain for the stimulated emission light each exhibit a periodical change at an identical single period in a guiding direction of the stimulated emission light. The laser device structure is configured so that the stimulated emission light is subject to an optical distributed feedback due to the periodical changes of the refractive index and the gain, thereby realizing laser oscillation. The periodical change of the gain in the laser device structure is based on absorption of the stimulated emission light. The laser device structure includes a phase discontinuous section where a phase of the periodical change of the refractive index and the gain is discontinuous.

According to still another aspect of the present invention, a method for producing a distributed feedback semiconductor laser diode is provided. The method includes the step of: forming a laser device structure having a refractive index distribution and a gain distribution where a refractive index and a gain for stimulated emission light generated in an active layer each exhibit a periodical change at an identical single period in a guiding direction of the stimulated emission light, the laser device structure being configured so that the stimulated emission light is subject to an optical distributed feedback due to the periodical changes of the refractive index and the gain, thereby realizing laser oscillation. The step of forming the laser device structure includes a step of forming a diffraction grating, including a phase discontinuous section, for generating the periodical changes of the refractive index and the gain for the stimulated emission light. A phase shift at the phase discontinuous section is set so as to maximize a side mode suppression ratio, which is a ratio of a second highest output to a highest output.

According to still another aspect of the present invention, an exposure method is provided. The method includes the steps of: placing a prism including first and second side surfaces opposing each other on a photosensitive material layer; and irradiating a surface of the photosensitive material layer with exposure light beams through the prism from the first and second side surfaces of the prism, so as to form diffraction-grating-like exposure patterns each including a phase shift section on a plurality of regions of the photosensitive material layer. The prism includes stepped regions provided on at least one of the first and second side surfaces, the stepped regions respectively corresponding to the regions of the photosensitive material layer, whereby a phase of the exposure light which has passed through one of the stepped regions and a phase of the exposure light beams passed through adjoining stepped regions are shifted from each other in a plane perpendicular to an axis of the exposure light beams.

The distributed feedback semiconductor laser diode of the present invention has a device structure including a refractive index distribution and a gain distribution where the refractive index and the gain for stimulated emission light form an active layer change at an identical single period in the guiding direction of the stimulated emission light. Moreover, the device structure includes a phase discontinuous section (phase shift section), where the phase of the periodical change of the refractive index and the gain is discontinuous. As a result, of the stimulated emission light subject to an optical distributed feedback, only a portion having a certain wavelength attains phase matching so as to achieve laser oscillation. Thus, it is possible in the semiconductor laser diode to realize stable oscillation with a single wavelength.

In the case of a semiconductor laser diode having a device structure where the refractive index distribution and the gain distribution coexist (i.e., a partial GC-DFB-LD), without phase shift in a structure where the refractive index and the gain for the stimulated emission light change periodically (i.e., the diffraction grating portion), phases of reflection waves at the Bragg wavelength do not match each other. As a result, oscillation at the Bragg wavelength is not obtained, and laser oscillation thereby becomes unstable. On the other hand, when a phase shift section exists in the diffraction grating portion as in the present invention, of the stimulated emission light subject to an optical distributed feedback, only a portion having a wavelength corresponding to the Bragg wavelength attains phase matching so as to achieve laser oscillation.

Moreover, by setting the phase shift to be greater than 0 [rad] but less than $\pi$ [rad], or greater than $\pi$ [rad] but less than $2\pi$ [rad], it becomes possible to maximize a side mode suppression ratio in a partial GC-DFB-LD, which indicates a difference in the output between at an oscillation wavelength providing the highest output (main mode) and at an oscillation wavelength providing the second highest output (side mode). Thus, it is possible to maintain a single wavelength oscillation even when stimulated emission light is directly modulated at a high speed.

Furthermore, in the device structure including the refractive index distribution and the gain distribution, the gain can be changed periodically based on the absorption of the stimulated emission light, and a phase discontinuous section where the phase of the periodical change of the refractive index and the gain is discontinuous can be provided. Thus, it is possible to provide a distributed feedback semiconductor laser diode including an absorption-based diffraction grating which is capable of realizing stable oscillation with a single wavelength.

When the phase of the periodical change of refractive index and the phase of the periodical change of gain match each other, the phase shift $\Omega$ at the phase discontinuous section is preferably set so that the following three expressions are generally satisfied.

$$\Omega[\mathrm{rad}] = \pi + 5.7 \cdot R - 2.6 \cdot R^2$$

$$R = \kappa g/(\kappa g^2 + \kappa i^2)^{1/2}$$

$$0 < R < 1$$

where $\kappa i$ is the refractive index coupling constant and $\kappa g$ is the gain coupling constant.

On the other hand, when the phase of the periodical change of refractive index and the phase of the periodical change of gain are opposite to each other, the phase shift $\Omega$ is set so that the following three expressions are generally satisfied.

$$\Omega[\text{rad}]=\pi-5.7\cdot R+2.6\cdot R^2$$

$$R=\kappa g/(\kappa g^2+\kappa i^2)^{1/2}$$

$$0<R<1$$

where $\kappa i$ is the refractive index coupling constant and $\kappa g$ is the gain coupling constant.

By thus setting the phase shift $\Omega$, it is possible to provide a distributed feedback semiconductor laser diode including an optimal device structure where stable laser oscillation can be obtained according to the ratio of the refractive index coupling constant and the gain coupling constant.

When the phase shift at the phase discontinuous section is set so that the refractive index coupling constant $\kappa i$ and the gain coupling constant $\kappa g$ satisfy the following two expressions, it is possible to maintain the stable laser oscillation even when the high speed direct modulation is performed, regardless of the reflectivity of the end faces of the device.

$$0.3 \leq R<1$$

$$R=\kappa g/(\kappa g^2+\kappa i^2)^{1/2}$$

Alternatively, when the phase shift at the phase discontinuous section is set so that the refractive index coupling constant $\kappa i$ and the gain coupling constant $\kappa g$ satisfy the following two expressions, it is possible to reduce the reflectivity of both end faces (substantially to zero). Thus, it is possible to maintain stable laser oscillation even when the high speed direct modulation is performed.

$$0<R<0.3$$

$$R=\kappa g/(\kappa g^2+\kappa i^2)^{1/2}$$

According to the method for producing the distributed feedback semiconductor laser diode of the present invention, when forming the device structure having the refractive index distribution and the gain distribution, a diffraction grating is formed to include a phase discontinuous section for generating periodical changes of refractive index and gain for the stimulated emission light, while the phase shift at the phase discontinuous section is set so as to maximize the side mode suppression ratio (which indicates a difference in the output between at an oscillation wavelength providing the highest output and at an oscillation wavelength providing the second highest output). Thus, it is possible to produce, with a high reproducibility, a partial GC-DFB-LD which is capable of maintaining a single wavelength oscillation even when stimulated emission light is directly modulated at a high speed.

Furthermore, when the phase shift at the phase discontinuous section is set based on the maximum value of the side mode suppression ratio (which is determined by the ratio of the refractive index coupling constant indicating the degree of a distributed feedback based on the refractive index distribution and the gain coupling constant indicating the degree of a distributed feedback based on the gain distribution), it is possible to provide the optimal device structure capable of realizing stable laser oscillation according to the ratio of the refractive index coupling constant and the gain coupling constant.

According to the exposure method of the present invention, when diffraction-grating-like exposure patterns each having a phase shift section is formed on a plurality of chip regions of a photosensitive material layer by using the dual light beam interference exposure method, a prism for forming interference fringes is utilized. The prism used herein includes first and second side surfaces, and stepped regions are formed on at least one of the side surfaces so as to respectively corresponding to the chip regions of the photosensitive material layer. Thus, exposure light beams passing through adjoining stepped regions will have shifted phases in the plane perpendicular to the light axis. By using the prism having such characteristics, the location on the photosensitive material at which the phase shift section is to be formed is determined with high accuracy and high reproducibility.

Moreover, when the diffraction-grating-like exposure patterns each having the phase shift section are formed on portions of the photoresist film (corresponding to the chip regions) applied onto the surface of the semiconductor wafer by using the above-described exposure method, the prism is placed on the photoresist film so that one or a plurality of adjoining stepped regions provided on at least one of the side surfaces respectively correspond to columns of the chip regions. In this way, it is possible, using a single prism, to easily form the diffraction-grating-like exposure patterns each including one or a plurality of phase shift sections on portions of the photoresist film respectively corresponding to the chip regions.

Thus, the invention described herein makes possible the advantages of: (1) providing a distributed feedback semiconductor laser diode which includes a device structure where a distributed feedback based on refractive index coupling and a distributed feedback based on gain coupling coexist, and which can maintain the single wavelength oscillation even when stimulated emission light is directly modulated at a high speed; (2) providing a method for producing such a distributed feedback semiconductor laser diode; and (3) providing an exposure method suitable for forming a mask pattern to be used for forming a diffraction grating in such a distributed feedback semiconductor laser diode.

These and other advantages of the present invention will become apparent to those skilled in the art upon reading and understanding the following detailed description with reference to the accompanying figures.

BRIEF DESCRIPTION OF THE DRAWINGS

FIGS. 3A and 3B are diagrams for illustrating the production process of a diffraction grating including a phase shift section for the semiconductor laser diode shown in FIG. 1, wherein FIG. 3A shows formation regions (i.e., chip regions) on a wafer where the semiconductor laser diodes are to be formed; and FIG. 3B shows the step of exposing the photoresist formed on the wafer to light.

FIGS. 10A and 10B are diagrams for illustrating a structure of a main portion of a conventional pure GC-DFB-LD, wherein FIG. 10A is a cross-sectional view showing a structure of an absorption-based diffraction grating formed in the vicinity of an active layer; and FIG. 10B shows refractive index distributions along line A-A' and line B-B' shown in FIG. 10A.

DESCRIPTION OF THE PREFERRED EMBODIMENTS

Hereinafter, the present invention will be described by way of illustrative examples with reference to the accompanying figures.

(EXAMPLE 1)

Figure 1:
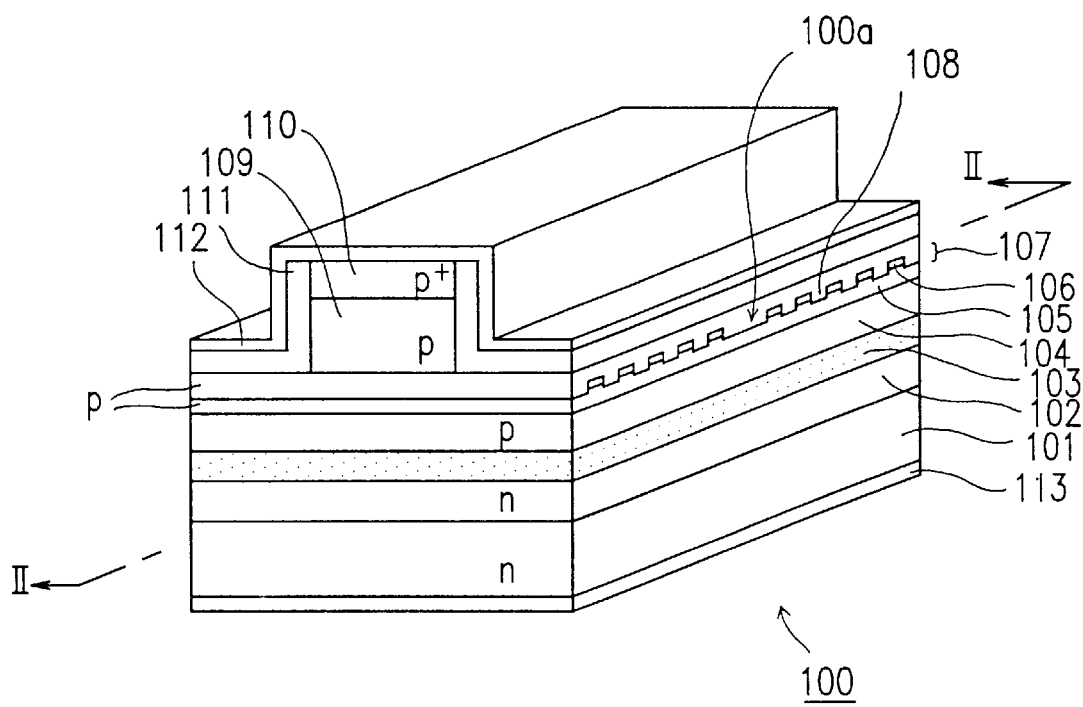
FIG. 1 is a perspective view showing a structure of a distributed feedback semiconductor laser diode (GC-DFB-LD) according to Example 1 of the present invention.

FIG. 1 is a perspective view showing a structure of a partial GC-DFB-LD 100 as a distributed feedback semiconductor laser diode according to Example 1 of the present invention.

The partial GC-DFB-LD 100 has an un-AlGaAs active layer 103 for generating stimulated emission light. Moreover, in the vicinity of the active layer 103, light absorbing regions 106 are provided periodically along the guiding direction of the stimulated emission light. Thus, there is provided a device structure in which the periodical change of gain is effectively provided.

More particularly, in the partial GC-DFB-LD 100, an n-$Al_{0.6}Ga_{0.4}As$ lower cladding layer 102 (about 1 μm thick) is formed on an n-GaAs substrate 101. An un-$Al_{0.13}Ga_{0.87}As$ active layer 103 (about 0.08 μm thick) is formed on the lower cladding layer 102. A p-$Al_{0.3}Ga_{0.7}As$ first guide layer 105 (about 0.058 μm thick) is formed on the active layer 103 via a p-$Al_{0.5}Ga_{0.5}As$ carrier barrier layer 104 (about 0.2 μm thick).

The first guide layer 105 includes a surface structure where convex/concave portions are provided in a repeated manner at constant pitches along the guiding direction of the stimulated emission light. A phase discontinuous section 100a is provided in the middle of the surface structure with respect to the guiding direction of the stimulated emission light.

The n-GaAs light absorbing layer 106 (about 0.012 μm thick) is provided on the convex portions of the first guide layer 105. GaAs as a constituent of the light absorbing layer 106 has a forbidden band width which is less than that of $Al_{0.13}Ga_{0.87}As$ as a constituent of the active layer 103. Therefore, the light absorbing layer 106 serves as an absorbent for the stimulated emission light generated in the active layer 103. Thus, an absorption-based diffraction grating is formed by the periodical arrangement of the light absorbing layer 106 with the phase discontinuous section 100a being provided in the middle of the arrangement with respect to the guiding direction of the stimulated emission light.

A p-$Al_{0.25}Ga_{0.75}As$ second guide layer 108 (about 0.030 μm thick) having a flat upper surface is formed on the first guide layer 105 and the light absorbing layer 106. $Al_{0.25}Ga_{0.75}As$ as a constituent of the second guide layer 108 has a refractive index which is different from that of GaAs as a constituent of the light absorbing layer 106. Thus, the semiconductor laser diode 100 of the present example is a partial GC-DFB-LD in which periodical distributions of refractive index and gain coexist.

A stripe-shaped p-$Al_{0.75}Ga_{0.25}As$ upper cladding layer 109 (about 0.8 μm thick) is formed having a smaller width on the second guide layer 108 to extend along the center line of the layer 108 in the guiding direction. A $p^+$-GaAs contact layer 110 (about 0.5 μm thick) is formed on the surface of the upper cladding layer 109. Herein, the respective widths of the upper cladding layer 109 and the contact layer 110 (i.e., the width of the stripe) is about 3 μm.

A silicon nitride insulating film 111 (about 0.3 μm thick) is formed so as to cover the side surfaces of the upper cladding layer 109 and the contact layer 110, and extends in the waveguide direction. The silicon nitride insulating film 111 also covers the portions of the surface of the second guide layer 108 that are not covered by the upper cladding layer 109. A p-electrode 112 is formed so as to cover the surface of the insulating film 111 and also the surface of the contact layer 110. Moreover, an n-electrode 113 is formed on the bottom surface of the substrate 101.

Hereinafter, the method for producing the semiconductor laser diode 100 of the present example will be described with reference to FIGS. 2A to 2E, 3A and 3B, and 4A and 4B.

Figure 2D:
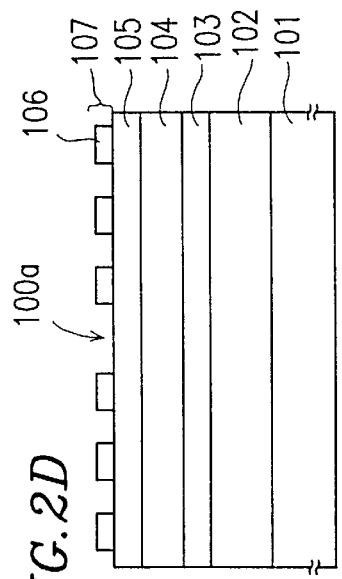
FIGS. 2A to 2E are cross-sectional views for illustrating a method for producing the semiconductor laser diode shown in FIG. 1 in the order of the main steps of the production, wherein each of FIGS. 2A to 2E shows a cross section of the semiconductor laser diode at the respective step taken along line II—II shown in FIG. 1.
Figure 2E:
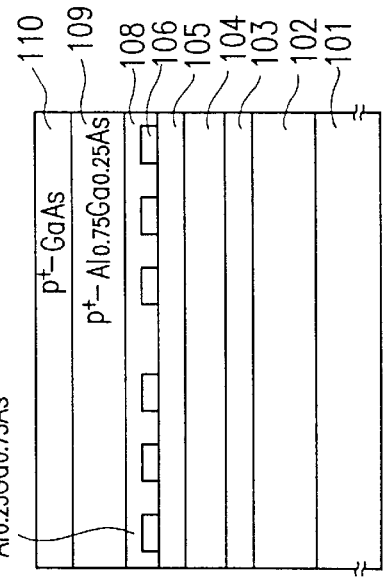
Figure 3A:
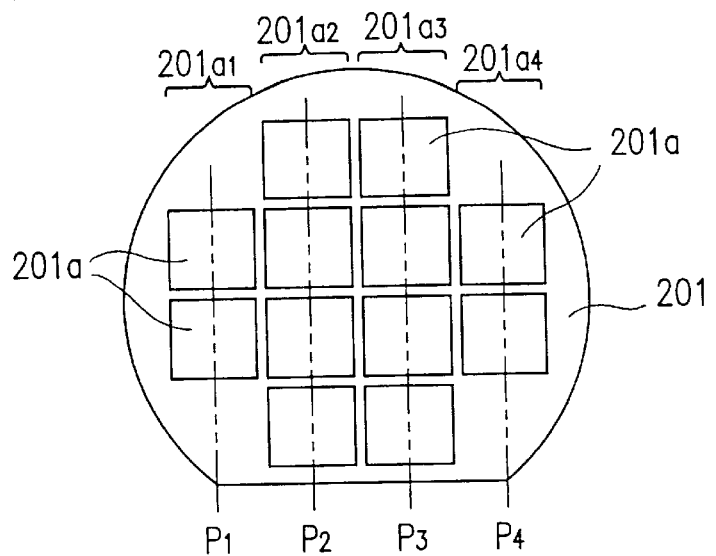
Figure 3B:
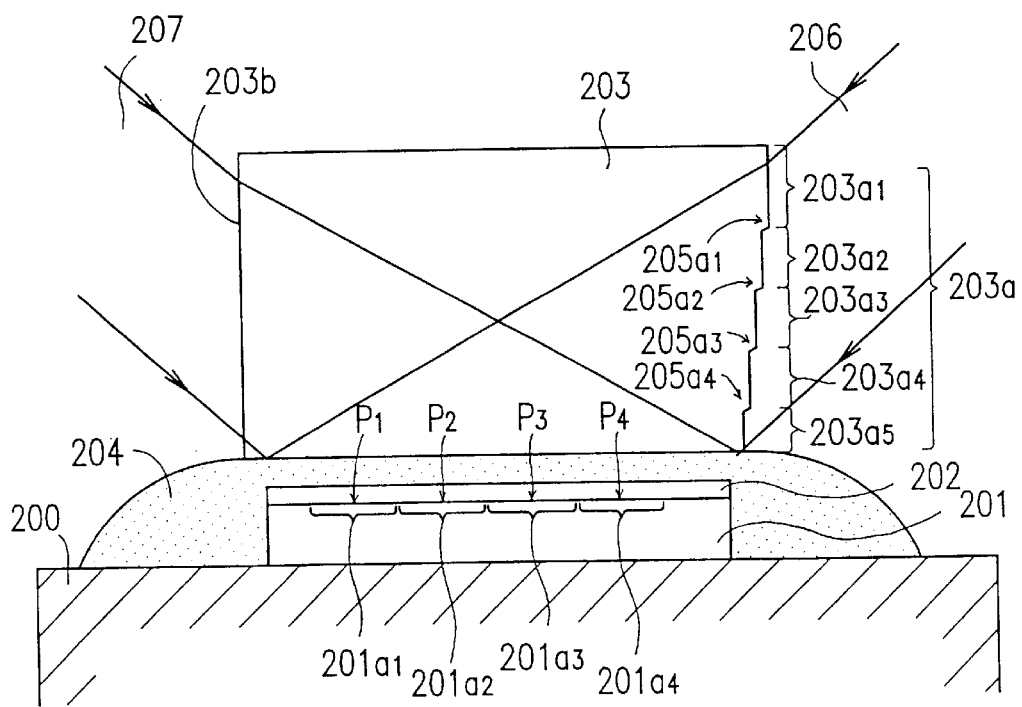
Figure 4A:
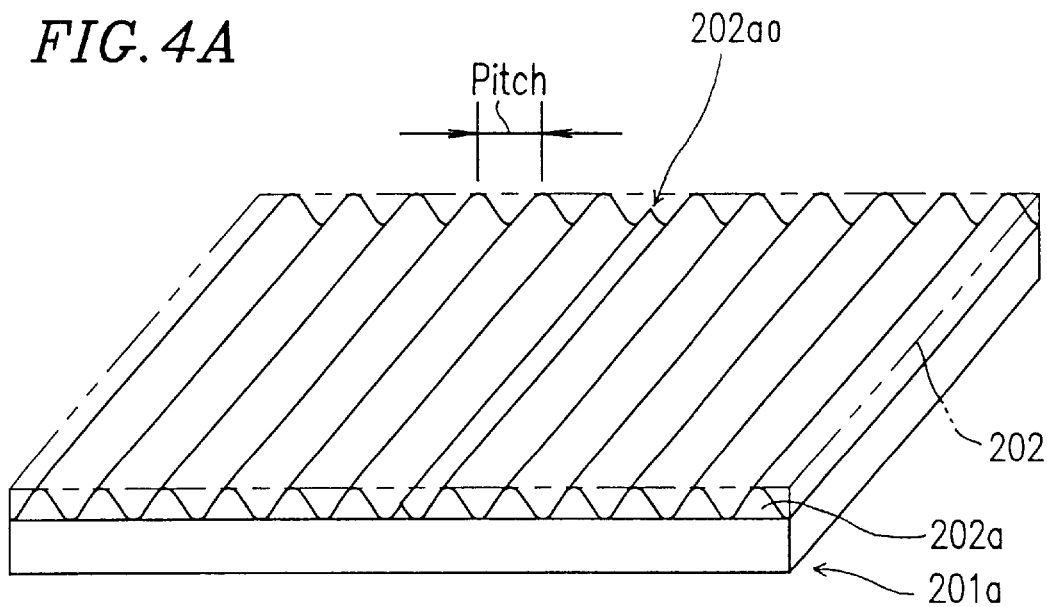
FIGS. 4A and 4B are a perspective view and a cross-sectional view, respectively, illustrating the resultant exposure pattern which is formed on the photoresist film on each of the respective chip regions by an exposure.
Figure 4B:
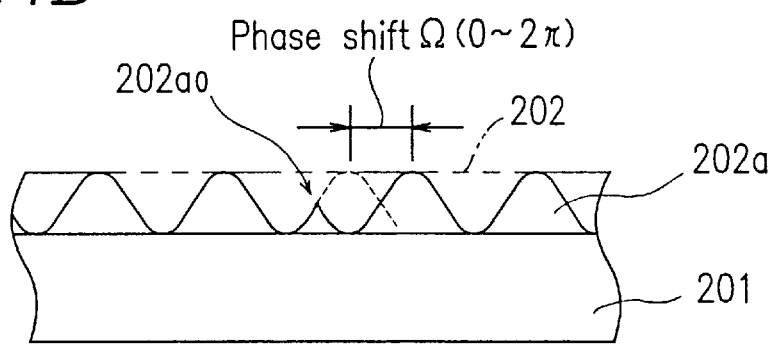

FIGS. 2A to 2E are cross-sectional views for illustrating the method for producing the semiconductor laser diode 100 in the order of the main steps of the production. Each of FIGS. 2A to 2E shows a cross section of the semiconductor laser diode 100 taken along line II—II in FIG. 1 at the respective step. FIGS. 3A and 3B are diagrams for illustrating the step of forming a resist mask to be used for forming the diffraction grating of the semiconductor laser diode 100. Particularly, FIG. 3A shows formation regions (i.e., chip regions) on a wafer where a plurality of the semiconductor laser diodes 100 are to be formed. FIG. 3B shows a step of exposing the photoresist formed on the wafer to light. For the purpose of simplification, it is assumed that twelve chip regions are provided on the wafer in FIG. 3A. Also note that one photoresist is illustrated in FIG. 3B. Moreover, FIGS. 4A and 4B are a perspective view and a cross-sectional view, respectively, illustrating the resultant exposure pattern formed on the photoresist film on the respective chip regions by the above exposure method. Like reference numbers denote like elements in FIGS. 1 through 4B.

In the production of the semiconductor laser diode 100 of the present example, the first crystal growth process is performed by using a metal-organic chemical vapor deposition (referred to also as an "MOCVD method", hereinafter) so as to form a plurality of semiconductor layers as constituents of the semiconductor laser diode 100 on the n-GaAs substrate 101 having a diameter of about 3 inches.

Figure 2A:
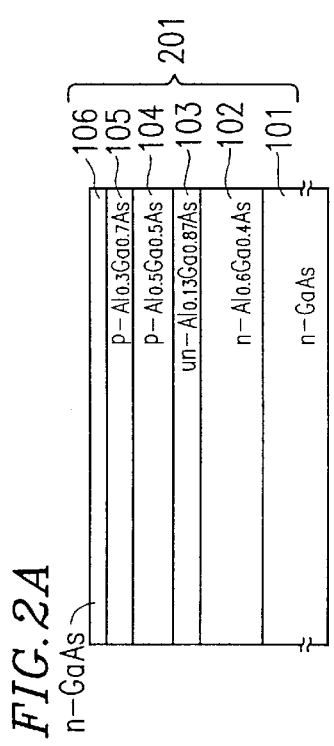

More particularly, in this first crystal growth process, the n-Al$_{0.6}$Ga$_{0.4}$As lower cladding layer 102 (about 1 μm thick), the un-Al$_{0.13}$Ga$_{0.87}$As active layer 103 (about 0.08 μm thick), and the p-Al$_{0.5}$Ga$_{0.5}$As carrier barrier layer 104 (about 0.2 μm thick) are formed in this order on the substrate 101 as shown in FIG. 2A. Moreover, the p-Al$_{0.3}$Ga$_{0.7}$As first guide layer 105 (about 0.058 μm thick) and n-GaAs layer 106 (about 0.012 μm thick) are formed in this order on the carrier barrier layer 104. Hereinafter, reference numeral 201 is used to denote the whole structure including the substrate 101 and the semiconductor layers 102 to 106 formed on the substrate 101.

Figure 2B:
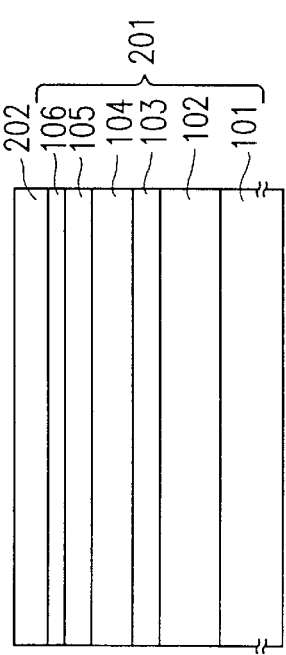

Subsequently, the substrate (wafer) 201 including a plurality of semiconductor layers formed thereon through the first crystal growth process is mounted on an exposure process table 200 (see FIG. 3B). Then, a diluted positive-type photoresist is applied onto the surface of the substrate 201, i.e., on the surface of the n-GaAs layer 106 (see FIG. 2A), to be about 50 nm thick, thus forming a photoresist film 202 as shown in FIG. 2B.

Then, as shown in FIG. 3B, a rectangular parallelepiped prism 203 which includes first to fourth steps 205a1 to 205a4 on a side surface thereof is placed, via xylene 204, on the substrate 201 including the photoresist film 202 formed thereon. Each of the steps 205a1 to 205a4 in FIG. 3B is a lateral change in vertical orientation of the prism side surface. The purpose of interposing the xylene 204 between the prism 203 and the photoresist film 202 on the surface of the substrate 201 is to suppress reflection of exposure light at the bottom surface of the prism 203.

The first to fourth steps 205a1 to 205a4 provided on a side surface 203a of the prism 203 respectively correspond to columns 201$_{a1}$ to 201$_{a4}$ (see FIG. 3A) of the chip regions 201a arranged in a matrix on the wafer 201. Particularly, a side face region 203a1, which extends upwardly from the highest first step 205a1, exists at the outermost position (i.e., at the rightmost position in the figure) among the side face regions 203a1–203a5. A side face region 203a2 between the first and second steps 205a1 and 205a2 extends to the next outermost position to the side face region 203a1. A side face region 203a3 between the second and third steps 205a2 and 205a3 extends to the next outermost position to the side face region 203a2. A side face region 203a4 between the third and fourth steps 205a3 and 205a4 extends to the next outermost to the side face region 203a3. Moreover, a side face region 203a5, which extends downwardly from the lowest fourth step 205a4, exists at a position inner than the side face region 203a4, in other words, at the innermost position (i.e., at the leftmost position in the figure) among the side face regions 203a1–203a5.

Figure 2C:
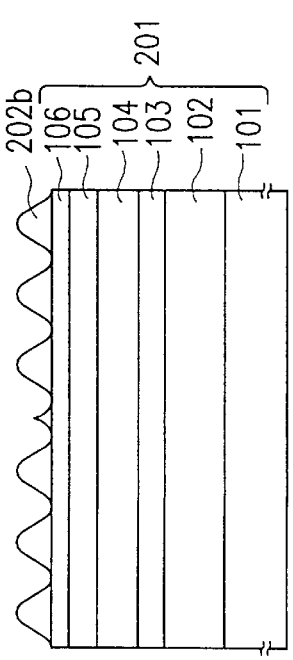

After mounting the prism 203 as described above, the photoresist film 202 is irradiated with a collimated light beam 206 of an Ar gas laser (about 351.1 nm in wavelength) through the prism 203 from the side surface 203a having steps 205a1 to 205a4, while the photoresist film 202 is irradiated with a collimated light beam 207 of an Ar gas laser (about 351.1 nm in wavelength) through the prism 203 from the side surface 203b having no step. Thus, an exposure pattern corresponding to interference fringes formed by the two collimated light beams 206 and 207 is formed on the photoresist film 202. After the exposure step, the resultant photoresist film 202 is developed with a suitable developing solution so as to form a diffraction-grating-like resist mask 202b with a pitch of about 120 nm as shown in FIG. 2C.

As described above, the prism 203 used in producing the diffraction-grating-like resist mask 202b includes the steps 205a1 to 205a4 on one side surface 203a. As the light beams pass through the respective side face regions 203a1 to 203a5 of the prism 203, the phases of the light beams are shifted from one another by a fixed amount based on differences in the optical path. Thus, the collimated light beam 206 which has passed through the side surface 203a of the prism 203 includes a portion in which the phase is shifted in the plane perpendicular to the light axis. On the other hand, the other collimated light beam 207 which has passed through the side surface 203b of the prism 203 has a phase which is uniform in the plane perpendicular to the light axis. The interference fringes formed on the surface of the photoresist 202 by two such light beams include a phase discontinuous section extending along center lines P1 to P4 (see FIG. 3A) of the chip regions 201a in each of the columns 201a1 to 201a4 on the wafer 201.

FIG. 4A is a perspective view showing a 3-dimensional exposure pattern 202a formed on the photoresist film 202 in one of the chip regions 201a. More particularly, the 3-dimensional exposure pattern 202a has linear convex/concave portions repeated at constant pitches on the surface of the substrate. Along the center line of the chip region, however, the phase discontinuous section (i.e., a phase shift section) 202a0 is provided by partially modulating the shape to be different from the rest of the repeated pattern. As shown in FIG. 4B, a phase shift Ω at the phase shift section 202a0 can be set to any value within a range between 0 [rad] to 2π [rad] by adjusting height of the steps 205a1 to 205a4 provided on the side surface 203a of the prism 203 (see FIG. 3B).

Using the thus produced diffraction-grating-like resist mask 202b, the surface of the light absorbing layer 106 produced through the first crystal growth process is wet-etched with a mixed solution of hydrochloric acid, hydrogen peroxide and pure water. Thus, the light absorbing layer 106 is patterned to have a shape which corresponds to the 3-dimensional shape of the resist mask 202b. As a result, an absorption-based diffraction grating 107 including the phase shift section 100a is formed as shown in FIG. 2D.

Next, as shown in FIG. 2E, the second crystal growth process is performed so as to form a plurality of semiconductor layers 108 to 110 on the surface of the layers formed through the first crystal growth process including the diffraction grating 107. Particularly, in the second crystal growth process, a p-Al$_{0.25}$Ga$_{0.75}$As second guide layer 108 with a flat top surface is formed so as to cover the light absorbing layer 106 and the first guide layer 105. The second guide layer 108 is formed to be about 0.030 μm thick. A p-Al$_{0.75}$Ga$_{0.25}$As upper cladding layer 109 is formed to be about 0.8 μm thick on the second guide layer 108. Finally, a p$^+$-GaAs contact layer 110 is formed to be about 0.5 μm thick on the upper cladding layer 109.

Then, by using a photolithography and a wet etching, the p-GaAs contact layer 110 and the p-AlGaAs upper cladding layer 109 are selectively etched so as to form stripe-shaped portions, each about 3 μm in width, extending in parallel to the guiding direction of the stimulated emission light. Thus, a ridge-type optical waveguide structure is produced.

After producing the optical waveguide structure as described above, the silicon nitride insulating film 111 is formed to be about 0.3 μm thick so as to cover the entire surface of the structure by using a plasma CVD method. Then, a portion of the insulating film 111 which is covering the upper surface of the ridged portion is removed from the structure. Next, a polishing process is performed to the bottom surface of the substrate 101 so as to reduce the thickness of the substrate 101 to about 100 μm. Thereafter, the p-electrode 112 is formed by using a vapor deposition so as to cover the semiconductor layers formed on the substrate 101. The n-electrode 113 is also formed on the bottom surface of the substrate 101 by using a vapor deposition. Then, the substrate 101 is divided by cleavage into chips each having a size of about 300 μm×about 300 μm, so that the ridged portion and the phase shift section are aligned along the center line of the respective semiconductor laser diode 100. Thus, the production of the semiconductor laser diode 100 is completed.

Herein, no particular coating is applied on the emission end face through which the laser light emits. Moreover, in an $Al_xGa_{1-x}As$ mixed crystal, as the mole fraction x decreases, the forbidden band width decreases while the refractive index increases. Therefore, in the diffraction grating 107 having the above-described structure, the portion where the gain is suppressed to be small corresponds to the portion where the refractive index is high. Thus, the phase of the periodical change of refractive index and the phase of the periodical change of gain are opposite to each other.

In the semiconductor laser diode 100 having the above-described structure, when coupling constants (which are parameters indicating the degree of a distributed feedback) are measured, a refractive index coupling constant κi indicating the degree of a distributed feedback based on the refractive index coupling is typically about 60 $cm^{-1}$, whereas a gain coupling constant κg indicating the degree of a distributed feedback based on the gain coupling is typically about 20 $cm^{-1}$. Thus, the produced semiconductor laser diode 100 is a partial GC-DFB-LD where the refractive index coupling and the gain coupling coexist. The coupling constants are explained in detail in, for example, The Bell System Technical Journal, vol. 48, page 2909 (1969).

Hereinafter, the function and the effect of the distributed feedback semiconductor laser diode 100 having the above-described structure according to the present example will be further described.

A plurality of sample devices respectively having various phase shifts ranging between 0 [rad] to 2π [rad] were produced as the distributed feedback semiconductor laser diode 100 having the absorption-based diffraction grating. A DC current was injected into each sample device so that the sample device emitted laser light at an output of several mWs from one end face. Side mode suppression ratios (referred to also as an "SMSR", hereinafter) for the respective phase shifts were measured. The SMSR is a ratio of an output obtained at an oscillation wavelength providing the second highest output (side mode) to an output at an oscillation wavelength providing the highest output (main mode).

Figure 5B:
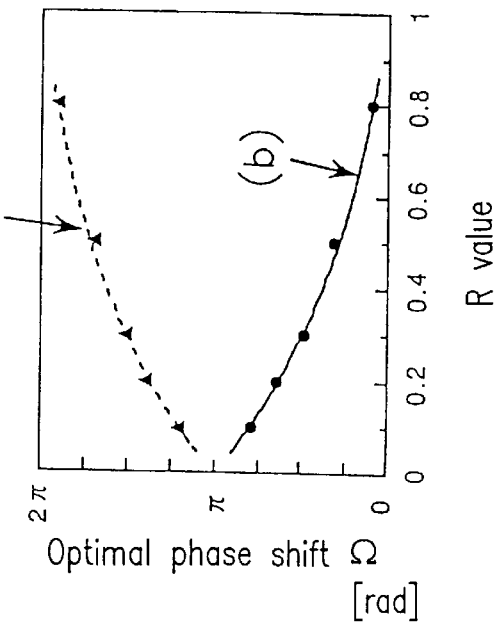
FIG. 5B shows the relationship between the R value and the optimal phase shift Ω of the GC-DFB-LD shown in FIG. 1.
Figure 5A:
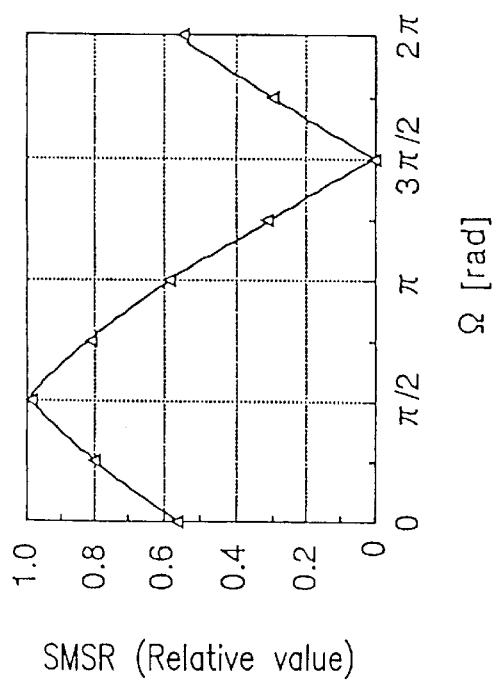
FIG. 5A shows the relationship between the SMSR and the phase shift Ω of the GC-DFB-LD shown in FIG. 1.

FIG. 5A shows the relationship between the average SMSR and the phase shift Ω of the sample devices. In the figure, the SMSR is expressed as a value relative to a maximum value set to be 1.0.

In the structure of the semiconductor laser diode 100 of the present example, even when the diffraction grating has no phase shift, a sufficiently high SMSR of about 20 dB or higher can be obtained due to the gain coupling effect. Moreover, it can be seen from FIG. 5A that, when the phase shift is set to be about π/2 [rad], an even higher SMSR can be obtained. The uniformity of the oscillation wavelength is thereby improved.

For example, the SMSR can be improved with the sample device which includes the phase shift section having a phase shift of π/4 [rad]. However, in such a sample device, discontinuous oscillation wavelengths or multiple oscillation wavelengths may occur during a high speed direct modulation. On the other hand, with the sample device which includes the phase shift section having a phase shift of π/2 [rad], the most stable oscillation with a single wavelength can be obtained.

Thus, the inventor of the present invention has been the first to discover that oscillation with a single wavelength can be well stabilized by introducing the optimal phase shift in a partial GC-DFB-LD. The partial GC-DFB-LD according to the present invention has excellent characteristics of oscillation with a single wavelength without generating a noise even when intense returning light exists. Thus, excellent laser oscillation characteristics, which are characteristic of GC-DFB-LDs, are observed.

By changing the compositions and/or thicknesses of the first guide layer 105, the light absorbing layer 106 and the second guide layer 108 in the structure of the semiconductor laser diode 100 shown in FIG. 1, other device structures can be produced with various combinations of the refractive index coupling constant κi and the gain coupling constant κg. In such a case, it is possible to realize either a device structure where the phase of the refractive index change matches the phase of the gain change, or a device structure where the phase of the refractive index change is opposite to the phase of the gain change.

For example, assume that the degree of gain coupling in a semiconductor laser diode is represented by an R value defined by the following expression.

$$R = \kappa g/(\kappa g^2 + \kappa i^2)^{1/2} \text{ (where: } 0 \leq R \leq 1)$$

Herein, a device structure where R=0 corresponds to an IC-DFB-LD, a device structure where 0<R<1 corresponds to a partial GC-DFB-LD, and device structure where R=1 corresponds to a pure GC-DFB-LD.

Considering the above, a plurality of sample devices were produced with different combinations of the refractive index coupling constant κi and the gain coupling constant κg, and also with different phase shifts. The SMSR was measured for each sample device. A non-reflection coating was applied onto the light emission end face of each sample device so that the reflectivity is suppressed to be 1% or less on both end faces and there is substantially no reflection at the laser emission end face.

FIG. 5B shows, for such a device structure having no end face reflection, the relationship between the R value and the optimal phase shift Ω for the diffraction grating which results in the highest SMSR. In the figure, each plot indicates the optimal phase shift for the R value of the produced sample device. From the results shown in FIG. 5B, the present inventors have discovered that, when 0<R<1 is satisfied for a partial GC-DFB-LD, there always exists the optimal phase shift Ω according to the degree of the gain coupling (i.e., the R value) of the GC-DFB-LD.

Moreover, the present inventors have also discovered the following. The optimal phase shift Ω exists within a range of π [rad]<Ω<2π [rad] as shown by triangular plots in FIG. 5B for the device structure where the phase of the refractive index change matches the phase of the gain change. On the other hand, the optimal phase shift Ω exists within a range of 0 [rad]<Ω<π [rad] as shown by circular plots in FIG. 5B for the device structure where the phase of the refractive index change is opposite to the phase of the gain change.

The relationship between the optimal phase shift and the R value is generalized by respectively fitting a quadratic equation to the triangular plots and the circular plots in FIG.

5B. For the device structure where the phase of the periodical change of refractive index matches the phase of the periodical change of gain, the relationship between the optimal phase shift and the R value, as shown by a broken line in FIG. 5B is generally expressed by the following expression (A).

$$\Omega[\text{rad}] = \pi + 5.7 \cdot R - 2.6 \cdot R^2 \quad (A)$$

On the other hand, for the device structure where the phase of the periodical change of refractive index is opposite to the phase of the periodical change of gain, the relationship between the optimal phase shift and the R value, as shown by a solid line in FIG. 5B, is generally expressed by the following expression (B).

$$\Omega[\text{rad}] = \pi - 5.7 \cdot R + 2.6 \cdot R^2 \quad (B)$$

Moreover, it can be seen from FIG. 5B that, for the semiconductor laser diode having a device structure where the refractive index distribution and the gain distribution coexist (i.e., a partial GC-DFB-LD), it is possible to maximize the side mode suppression ratio when the phase shift is greater than 0 [rad] but less than π [rad], or greater than π [rad] but less than 2π [rad] (i.e., the substantial phase shift Ω is not π [rad]).

Figure 5C:
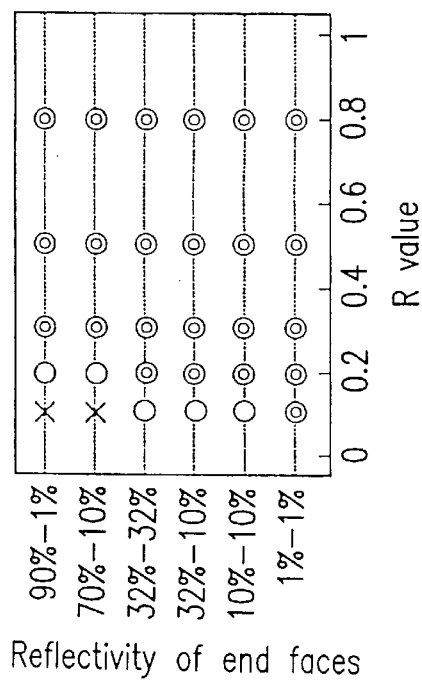
FIG. 5C shows the relationship between the reflectivity of the end faces and the R value of the GC-DFB-LD shown in FIG. 1.

FIG. 5C shows influences of the reflectivity of the end faces in the device structure where a phase shift diffraction grating is introduced in a partial GC-DFB-LD. In FIG. 5C, cross-mark plots indicate the case where oscillation with a single wavelength is not obtained with the device structure. Single-circle plots indicate the case where oscillation with a single wavelength is obtained with the device structure when driven with a DC current, but not obtained during the high speed modulation. Double-circle plots indicate the case where oscillation with a single wavelength is obtained with the device structure even during the high speed modulation.

As seen in the figure, with a device structure whose gain coupling is weak (R<0.3), oscillation with a single wavelength is not realized during the high speed modulation unless the reflectivity is sufficiently lowered at both end faces. Thus, the oscillation wavelength is not stable. On the other hand, with a device structure whose gain coupling is strong (R≧0.3), oscillation with a single wavelength is realized during the high speed modulation without lowering the reflectivity of the end faces. Thus, the oscillation wavelength is stable. Moreover, the semiconductor laser diodes having these device structures have excellent characteristics with respect to realizing the single wavelength oscillation without generating a noise even when intense returning light exists. Thus, excellent laser oscillation characteristics, which are unique to GC-DFB-LDs, are observed.

As described above, it is practically possible to produce a semiconductor laser diode where the diffraction grating having the optimal phase shift is introduced in the partial GC-DFB-LD in accordance with the present invention, while it is practically difficult to produce the pure GC-DFB-LD. Moreover, such a partial GC-DFB-LD most effectively realizes the various advantages of the pure GC-DFB-LDs. The semiconductor laser diode having a device structure where R≧0.3 is particularly excellent in that it realizes oscillation with a single wavelength regardless of whether the end face is coated.

Moreover, in the present example, when the diffraction-grating-like exposure patterns each including a phase shift section are formed on portions of the photoresist film which respectively correspond to the chip regions, the dual light beam interference exposure method is employed. Particularly, when the dual light beam interference exposure method is employed in accordance with the present example, a prism mounted on the photoresist film includes stepped regions which are provided on at least one of the first and second side surfaces thereof. The stepped regions respectively correspond to the chip regions of the photoresist film. The photoresist film is irradiated with exposure light beams through both of the side surfaces of the prism. In this way, the location at which the phase shift section is to be provided on the photoresist film is determined more accurately with better reproducibility than conventional methods where a photoresist film is directly irradiated with one exposure light beam while further irradiated with another exposure light beam through a phase plate provided above the photoresist film.

In the present example, the diffraction grating 107 included in the partial GC-DFB-LD 100 has one phase shift section. Alternatively, the diffraction grating may include a plurality of phase shift sections.

Figure 6:
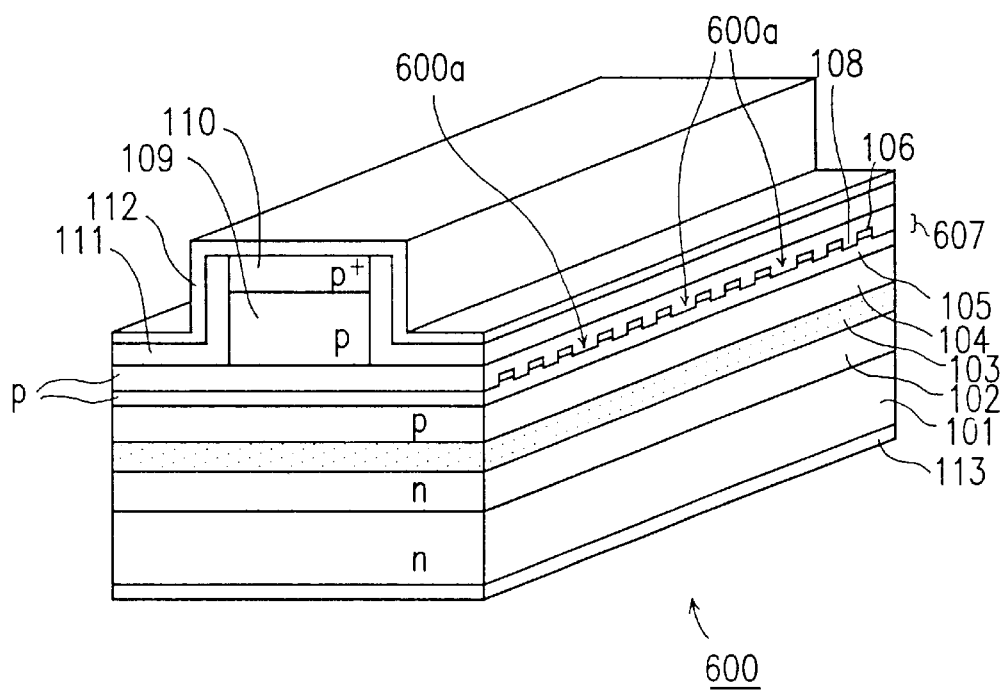
FIG. 6 is a perspective view showing a modified structure of a distributed feedback semiconductor laser diode (GC-DFB-LD) according to Example 1 of the present invention.

FIG. 6 is a perspective view showing a structure of a partial GC-DFB-LD 600 including a plurality of phase shift sections 600a, as a modified example of the partial GC-DFB-LD 100 of Example 1. In the partial GC-DFB-LD 600 shown in FIG. 6, elements which are the same as those in the partial GC-DFB-LD 100 shown in FIG. 1 are denoted by the same reference numerals as in FIG. 1, and such elements will not be further described below.

In particular, the partial GC-DFB-LD 600 has an absorption-based diffraction grating 607 including phase shift sections 600a provided in three different locations. Also with this partial GC-DFB-LD 600, the SMSR can be set to the maximum value by setting the phase shifts at the respective phase shift sections 600a in such a manner that the total phase shift satisfies the above expression (A) or (B). Thus, it is possible to attain the single wavelength oscillation even when stimulated emission light is directly modulated.

(EXAMPLE 2)

Figure 7:
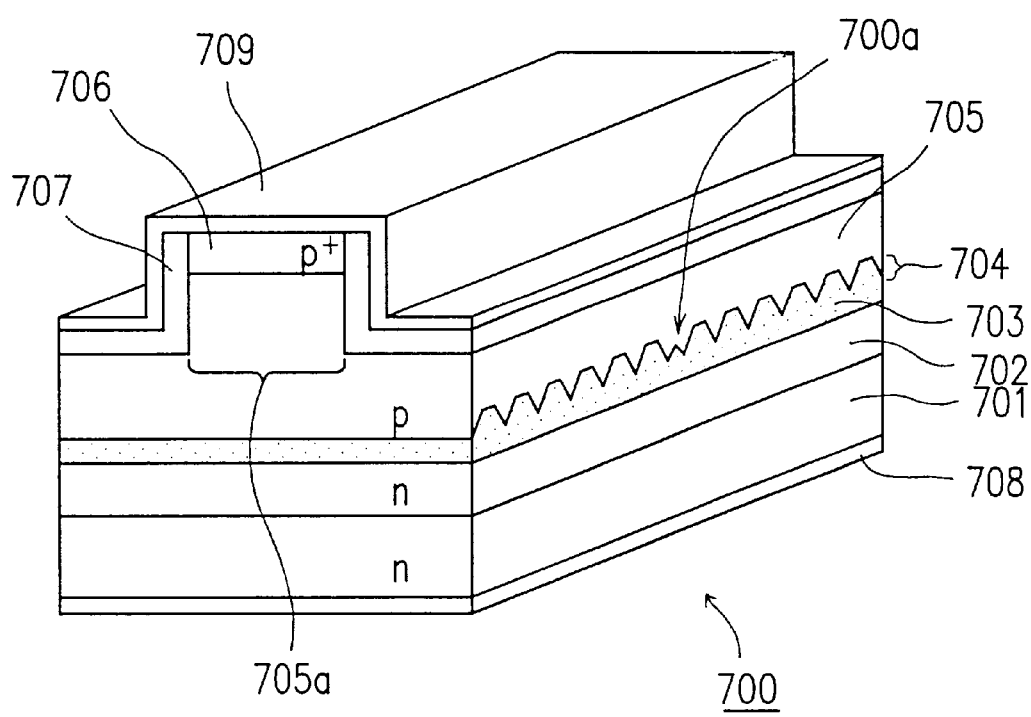
FIG. 7 is a perspective view showing a structure of a distributed feedback semiconductor laser diode (GC-DFB-LD) according to Example 2 of the present invention.

FIG. 7 is a perspective view showing a structure of a partial GC-DFB-LD 700 as a distributed feedback semiconductor laser diode according to Example 2 of the present invention.

The partial GC-DFB-LD 700 has an un-InGaAsP active layer 703 for generating stimulated emission light. Moreover, in the surface region of the active layer 703, a plurality of concave/convex portions are provided periodically along the guiding direction of the stimulated emission light. Thus, there is provided a device structure in which the periodical change of gain is effectively provided.

A gain-based diffraction grating 704 including the plurality of concave/convex portions is formed in the surface region of the active layer 703. The diffraction grating 704 includes a phase shift section 700a.

More particularly, in the partial GC-DFB-LD 700, an n-InP lower cladding layer 702 (about 1 μm thick) is formed on an n-InP substrate 701. The un-InGaAsP active layer 703 (about 0.1 μm thick) is formed on the lower cladding layer 702. A p-InP upper cladding layer 705 including a stripe-shaped convex portion 705a along the center line thereof is formed on the active layer 703. Moreover, a p$^+$-InGaAs contact layer 706 is formed on the surface of the stripe-shaped convex portion 705a of the upper cladding layer 705.

A silicon nitride insulating film 707 (about 0.3 μm thick) is formed so as to cover the side surfaces of the stripe-shaped convex portion 705a of the upper cladding layer 705 and the contact layer 706 extending in parallel to the waveguide direction, and also to cover the surface of the upper cladding layer 705. A p-electrode 709 is formed so as to cover the surface of the insulating film 707 and also the top surface of the contact layer 706. Moreover, an n-electrode 708 is formed on the bottom surface of the substrate 701.

Hereinafter, the method for producing the semiconductor laser diode 700 of the present example will be described.

In the production of the semiconductor laser diode 700 of the present example, the first crystal growth process is performed by using the MOCVD method so as to form a plurality of semiconductor layers as constituents of the semiconductor laser diode 700 on the n-InP substrate 701. More particularly, in this first crystal growth process, the n-InP lower cladding layer 702 (about 1 μm thick), and the un-InGaAsP active layer 703 (about 0.1 μm thick) having a composition wavelength λ of about 1.3 μm are grown in this order on the substrate 701. Subsequently, a negative-type photoresist for electron beam exposure is applied onto the uppermost surface of the grown layers, i.e., on the surface of the active layer 703 to be about 100 nm thick, thus forming the photoresist film.

Then, using an electron beam exposure apparatus, diffraction grating patterns with a pitch of about 240 nm each including a phase shift section are drawn directly on the photoresist film. The resultant photoresist film is developed with a suitable developing solution so as to form a diffraction-grating-like resist mask similar to that shown in FIGS. 4A and 4B.

Using the produced diffraction-grating-like resist mask, a wet etching is performed so as to partially remove the active layer 703 produced through the first crystal growth process. When the photoresist film is removed, a plurality of V-shaped grooves are formed in the active layer 703. Thus, the diffraction grating 704 is produced.

Next, the second crystal growth process is performed so as to form a p-InP upper cladding layer 705 to be about 1 μm thick on the surface of the active layer 703 including the diffraction grating 704. Finally, a p$^+$-InGaAs contact layer 706 is formed to be about 0.5 μm thick.

Then, by using a photolithography and a wet etching, the contact layer 706 and the upper cladding layer 705 are selectively etched so as to form a stripe-shaped portion about 2 μm in width. Thus, a ridge-type optical waveguide structure is produced. Herein, the ridge-type optical waveguide structure is formed to be parallel to a direction which is orthogonal to the diffraction grating 704.

After producing the optical waveguide structure as described above, the silicon nitride insulating film 707 is formed to be about 0.3 μm thick covering the entire surface of the structure by using a plasma CVD method. Then, a portion of the insulating film 707 which is covering the upper surface of the ridged portion is removed from the structure. Next, a polishing process is performed to the bottom surface of the substrate 701 so as to reduce the thickness of the substrate 701 to about 100 μm. Thereafter, the p-electrode 709 is formed by using a vapor deposition so as to cover the semiconductor layers formed on the upper surface of the substrate 701. The n-electrode 708 is formed on the bottom surface of the substrate 701 by using a vapor deposition.

Then, the substrate 701 is divided by cleavage into chips each having a size of about 250 μm×about 250 μm so that the ridged portion 705a and the phase shift section 700a are aligned along the center line of the respective semiconductor laser diodes 700. Thus, the production of the semiconductor laser diode 700 is completed.

Although not illustrated in FIG. 7, one of the laser light emission end faces of the semiconductor laser diode 700 is coated with a high reflectivity film having a reflectivity of about 90%, while the other end face is coated with a low reflectivity film having a reflectivity of about 10%.

In the diffraction grating 704 having the above-described structure, a portion having a large refractive index also has a large gain. Thus, the phase of the refractive index change and the phase of the gain change match each other along the guiding direction of the stimulated emission light.

In the semiconductor laser diode 700 having the above-described structure, as the coupling constants, the refractive index coupling constant κi is typically about 35 cm$^{-1}$, whereas the gain coupling constant κg is typically about 20 cm$^{-1}$. The R value calculated from these coupling constants becomes R=0.5.

Hereinafter, the function and the effect of the distributed feedback semiconductor laser diode 700 having the above-described structure according to the present example will be further described.

As the semiconductor laser diode (partial GC-DFB-LD) 700 having the gain-based diffraction grating 704, a plurality of sample devices respectively having various phase shifts ranging between 0 [rad] to 2π [rad] were produced. A DC current was injected into each sample device so that the sample device emits laser light at an output of several mWs from one end face. The SMSR value for the respective phase shifts was measured.

Figure 8:
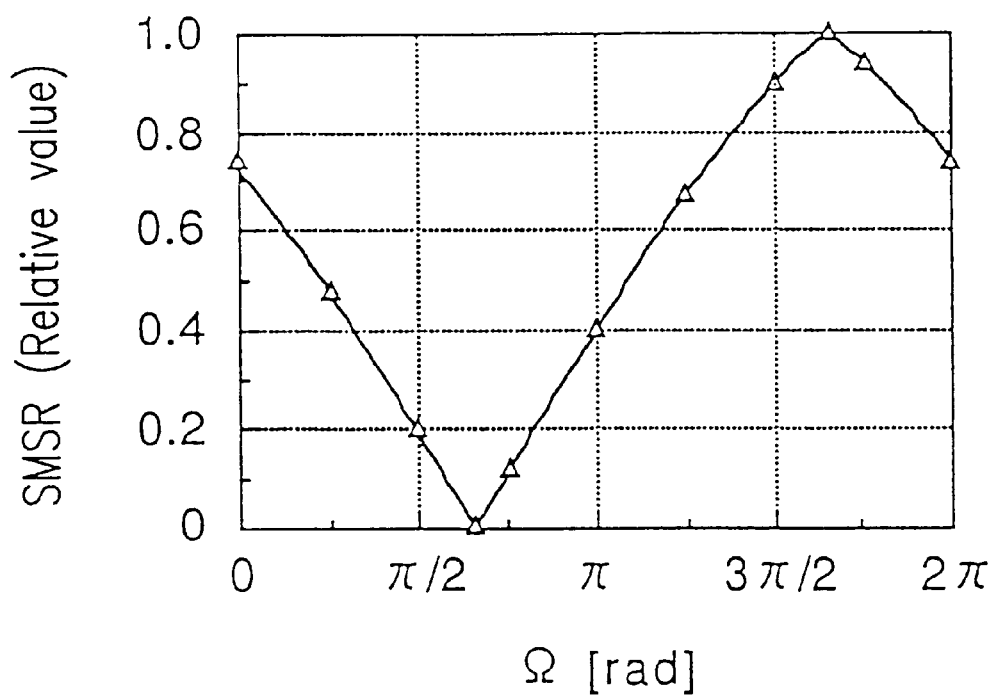
FIG. 8 shows the relationship between the SMSR and the phase shift Ω of the GC-DFB-LD shown in FIG. 7.
Figure 9:
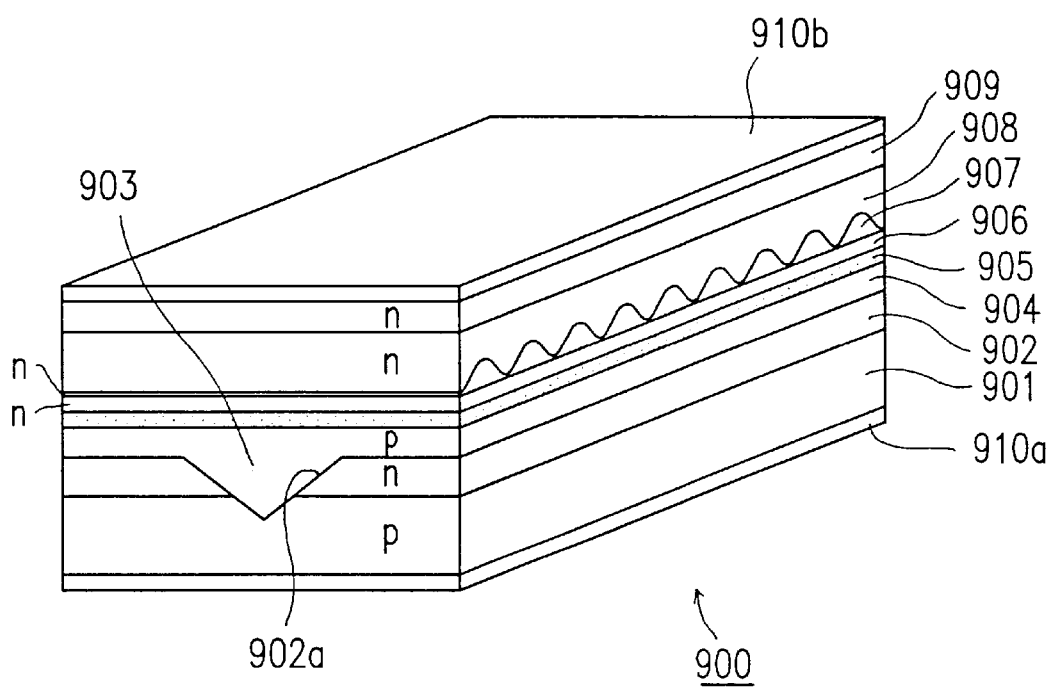
FIG. 9 is a perspective view showing a structure of a conventional GC-DFB-LD.
Figures 10A, 10B:
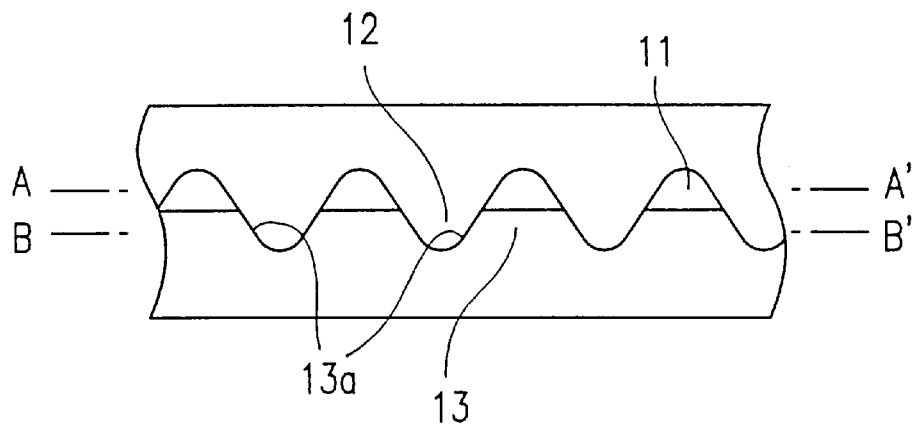

FIG. 8 shows the relationship between the average SMSR and the phase shift Ω of the sample devices. In the figure, the SMSR is expressed as a relative value obtained by setting the maximum value thereof to be 1.0.

In the structure of the semiconductor laser diode 700 of the present example, even when the diffraction grating has no phase shift, a sufficiently high SMSR of about 25 dB or higher can be obtained due to the gain coupling effect. Moreover, it can be seen from FIG. 8 that, when the phase shift is set to be about 5.3 [rad], an even higher SMSR can be obtained. The uniformity of the oscillation wavelength is thereby improved.

When the direct modulation was actually performed at a high speed for each sample device, the sample device having a phase shift of about 5.3 [rad] most stably oscillated with a single wavelength without involving the discontinuous shift (mode hopping) of the oscillation wavelength or the multi-mode oscillation with a plurality of the oscillation wavelengths.

The relationship between the R value and the phase shift Ω as shown in FIG. 5B in connection with Example 1 is applicable, not only in the structure of the semiconductor laser diode 100 of Example 1 including the absorption-based diffraction grating where the light absorbing layer 106 is periodically arranged, but also in the device structure of the semiconductor laser diode 700 of the present example (see FIG. 7) including the gain-based diffraction grating where the active layer itself is provided with a periodical change of gain.

Materials for constituting the above-described semiconductor laser diodes of the present invention are not limited to those shown in the above examples. In particular, the present invention is applicable for semiconductor laser diodes made of III-V group compound semiconductor material system, including Al, Ga or In as the III group element and P, As or N as the V group element, or for semiconductor laser diodes made of II-VI group compound semiconductor material system, including Zn, Mg or Cd as the II group element and S, Se or Te as the VI group element.

Moreover, the method for producing a diffraction grating and the method for producing a phase shift section are not limited to those shown in the above-described examples. For example, in the case where, especially, a DFB-LD is used as a monolithic light source for optical ICs, it is effective to directly draw a diffraction-grating-like resist mask including a phase shift section by using the electron beam exposure method.

Furthermore, the structure of the diffraction grating including the phase shift section is not limited to that in the semiconductor laser diode 100 of Example 1, where one phase shift section is provided along the center line of the laser diode, or it is not limited to that in the semiconductor laser diode 600 as a modified example of Example 1, where a plurality of phase shift sections are provided (multi-shift type). Rather, any diffraction grating structures with the configuration of various phase shift section(s) known for the IC-DFB-LDs may be employed. For example, a graded shift type structure where the phase gradually shifts, or a stripe width shift type structure where a width of a stripe-shaped refractive index waveguide is changed so as to realize an effective phase shift, and the like, may be employed.

Furthermore, the reflectivity of the end faces of the semiconductor laser diode can be controlled by employing thin film coating with various known materials. For semiconductor laser diodes with a small R value, the reflectivity of the end face can be lowered by a non-reflection coating with a thin film in the above-described examples. Alternatively, various other known structures for the end faces can be employed. For example, it is possible to provide the end faces with a rough surface, to cut off the end face at an inclined angle, or to employ a window structure for the end face section. Any of these end face structures can be employed in combination with a diffraction grating including a phase shift section.

As for the structure and production method of the stripe-shaped optical waveguides, other than those of the ridge-type optical waveguide described in the above examples, various other structures and production methods may also be employed. For example, a stripe electrode type, a BH (Buried Heterostructure) type, and the like, may be employed.

As described above, the distributed feedback semiconductor laser diode of the present invention has a device structure including a refractive index distribution and a gain distribution where the refractive index and the gain for stimulated emission light from an active layer change at an identical single period in the guiding direction of the stimulated emission light. Moreover, the device structure includes a phase discontinuous section (phase shift section), where the phase of the periodical change of the refractive index and the gain is discontinuous. As a result, of the stimulated emission light subject to an optical distributed feedback, only a portion having a certain wavelength attains phase matching so as to achieve laser oscillation. Thus, it is possible to realize stable oscillation with a single wavelength even during the high speed modulation of the semiconductor laser diode.

By setting the phase shift to be greater than 0 [rad] but less than $\pi$ [rad], or greater than $\pi$ [rad] but less than $2\pi$ [rad], it becomes possible to maximize a side mode suppression ratio in a partial GC-DFB-LD. Thus, it is possible to maintain a single wavelength oscillation even when stimulated emission light is directly modulated at a high speed.

Furthermore, in the device structure including the refractive index distribution and the gain distribution, the gain is periodically changed based on the absorption of the stimulated emission light, and a phase discontinuous section where the phase of the periodical change of the refractive index and the gain is discontinuous can be provided. Thus, it is possible to provide a distributed feedback semiconductor laser diode including an absorption-based diffraction grating which is capable of realizing stable oscillation with a single wavelength.

By setting the phase shift $\Omega$ at the phase discontinuous section so as to satisfy predetermined expressions with the refractive index coupling constant $\kappa i$ and the gain coupling constant $\kappa g$ being parameters of the expressions, it is possible to provide a distributed feedback semiconductor laser diode including an optimal device structure where stable laser oscillation can be obtained according to the ratio of the refractive index coupling constant and the gain coupling constant.

By setting the gain coupling property in the distributed feedback semiconductor laser diode to be a predetermined level or stronger, it is possible to maintain the stable laser oscillation even during the high speed direct modulation, regardless of the reflectivity of the end faces of the device.

Alternatively, by setting the gain coupling property in the distributed feedback semiconductor laser diode to be weaker than a predetermined level, it is possible to reduce the reflectivity of both end faces (to substantially zero). Thus, it is possible to maintain stable laser oscillation even during the high speed direct modulation.

As described above, in accordance with the present invention, it is possible to provide structures for a laser device of a partial GC-DFB-LD which can be easily produced, which can realize stable oscillation with a single wavelength, and which can most effectively realize the various advantages of GC-DFB-LDs.

Furthermore, in the method for producing the distributed feedback semiconductor laser diode of the present invention, when forming the device structure having the refractive index distribution and the gain distribution, a diffraction grating is formed to include a phase discontinuous section for generating periodical changes of refractive index and gain for the stimulated emission light, while the phase shift at the phase discontinuous section is set so as to maximize the side mode suppression ratio (which indicates a difference in output between at an oscillation wavelength providing the highest output and at an oscillation wavelength providing the second highest output). Thus, it is possible to produce, with a high reproducibility, a partial GC-DFB-LD which is capable of maintaining a single wavelength oscillation even when stimulated emission light is directly modulated at a high speed.

Furthermore, when the phase shift at the phase discontinuous section is set based on the maximum value of the side mode suppression ratio (which is determined by the ratio of the refractive index coupling constant indicating the degree of a distributed feedback based on the refractive index distribution and the gain coupling constant indicating the degree of a distributed feedback based on the gain distribution), it is possible to provide the optimal device structure capable of realizing stable laser oscillation according to the ratio of the refractive index coupling constant and the gain coupling constant.

According to the exposure method of the present invention, when the diffraction-grating-like exposure patterns each having a phase shift section are formed on a plurality of chip regions of a photosensitive material layer by using the dual light beam interference exposure method, a prism for forming interference fringes in utilized. The prism used herein includes first and second side surfaces, and stepped regions are formed on at least one of the side surfaces so as to respectively corresponding to the chip regions of the photosensitive material layer. Thus, exposure light beams passing through adjoining stepped regions will have shifted phases in the plane perpendicular to the light axis. By using the prism having such characteristics, the location at which the phase shift section is to be formed on the photosensitive material is determined with high accuracy and high reproducibility.

Moreover, when the diffraction-grating-like exposure patterns each including a phase shift section are formed on portions of the photoresist film (corresponding to the chip regions) applied onto the surface of the semiconductor wafer by using the above-described exposure method, the prism is placed on the photoresist film so that the one or a plurality of adjoining stepped regions provided on at least one of the side surfaces respectively correspond to columns of the chip regions. In this way, it is possible, with one prism, to easily form the diffraction-grating-like exposure patterns each including one or a plurality of phase shift sections on portions of the photoresist film respectively corresponding to the chip regions.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A distributed feedback semiconductor laser diode, comprising:
   an active layer for generating stimulated emission light; and
   a laser device structure having a refractive index distribution and a gain distribution where a refractive index and a gain for the stimulated emission light each exhibit a periodical change at an identical single period in a guiding direction of the stimulated emission light, wherein:
      the laser device structure is configured so that the stimulated emission light is subject to an optical distributed feedback due to the periodical changes of the refractive index and the gain, thereby realizing laser oscillation; and
      the laser device structure includes a phase discontinuous section where a phase of the periodical change of the refractive index and the gain is discontinuous, a phase shift at the phase discontinuous section being within a range greater than 0 [rad] but less than $\pi$ [rad], or within a range greater than $\pi$ [rad] but less than $2\pi$ [rad].

2. A distributed feedback semiconductor laser diode according to claim 1, wherein the laser device structure is configured so that a phase of the periodical change of the refractive index and a phase of the periodical change of the gain in the guiding direction of the stimulated emission light match each other, and the phase shift at the phase discontinuous section is set to be greater than $\pi$ [rad] but less than $2\pi$ [rad].

3. A distributed feedback semiconductor laser diode according to claim 2, wherein the phase shift $\Omega$ at the phase discontinuous section is set so that three expressions below are generally satisfied based on a refractive index coupling constant $\kappa i$ indicating a degree of a distributed feedback based on the refractive index distribution and a gain coupling constant $\kappa g$ indicating a degree of a distributed feedback based on the gain distribution:

$$\Omega[\text{rad}]=\pi+5.7\cdot R-2.6\cdot R^2$$

$$R=\kappa g/(\kappa g^2+\kappa i^2)^{1/2}$$

$$0<R<1.$$

4. A distributed feedback semiconductor laser diode according to claim 1, wherein the laser device structure is configured so that a phase of the periodical change of the refractive index and a phase of the periodical change of the gain in the waveguide direction of the stimulated emission light are opposite to each other, and the phase shift at the phase discontinuous section is set to be greater than 0 [rad] but less than $\pi$ [rad].

5. A distributed feedback semiconductor laser diode according to claim 4, wherein the phase shift $\Omega$ at the phase discontinuous section is set so that three expressions below are generally satisfied based on a refractive index coupling constant $\kappa i$ indicating a degree of a distributed feedback based on the refractive index distribution and a gain coupling constant $\kappa g$ indicating a degree of a distributed feedback based on the gain distribution:

$$\Omega[\text{rad}]=\pi-5.7\cdot R+2.6\cdot R^2$$

$$R=\kappa g/(\kappa g^2+\kappa i^2)^{1/2}$$

$$0<R<1.$$

6. A distributed feedback semiconductor laser diode according to claim 1, wherein the phase shift $\Omega$ at the phase discontinuous section is set so that a refractive index coupling constant $\kappa i$ indicating a degree of a distributed feedback based on the refractive index distribution and a gain coupling constant $\kappa g$ indicating a degree of a distributed feedback based on the gain distribution generally satisfy two expressions below:

$$0.3 \leq R<1$$

$$R=\kappa g/(\kappa g^2+\kappa i^2)^{1/2}.$$

7. A distributed feedback semiconductor laser diode according to claim 1, wherein:
   the laser device structure is configured so that either one of laser emission end faces of the laser device structure provides substantially no light reflection; and
   the phase shift $\Omega$ at the phase discontinuous section is set so that a refractive index coupling constant $\kappa i$ indicating a degree of a distributed feedback based on the refractive index distribution and a gain coupling constant $\kappa g$ indicating a degree of a distributed feedback based on the gain distribution generally satisfy two expressions below:

$$0<R<0.3$$

$$R=\kappa g/(\kappa g^2+\kappa i^2)^{1/2}.$$

8. A distributed feedback semiconductor laser diode, comprising:
   an active layer for generating stimulated emission light; and
   a laser device structure having a refractive index distribution and a gain distribution where a refractive index and a gain for the stimulated emission light each exhibit a periodical change at an identical single period in a guiding direction of the stimulated emission light, wherein:

the laser device structure is configured so that the stimulated emission light is subject to an optical distributed feedback due to the periodical changes of the refractive index and the gain, thereby realizing laser oscillation;

the periodical change of the gain in the laser device structure is based on absorption of the stimulated emission light; and the laser device structure includes a phase discontinuous section where a phase of the periodical change of the refractive index and the gain is discontinuous, a phase shift at the phase discontinuous section being within a range greater than 0 (rad) but less than $\pi$ (rad), or within a range greater than $\pi$ (rad) but less than $2\pi$ (rad).

9. A distributed feedback semiconductor laser diode according to claim 8, wherein the laser device structure is configured such that a phase of the periodical change of the refractive index and a phase of the periodical change of the gain in the guiding direction of the stimulated emission light match each other, and the phase shift at the phase discontinuous section is set to be greater than $\pi$ [rad] but less than $2\pi$ [rad].

10. A distributed feedback semiconductor laser diode according to claim 9, wherein the phase shift $\Omega$ at the phase discontinuous section is set so that three expressions below are generally satisfied based on a refractive index coupling constant $\kappa i$ indicating a degree of a distributed feedback based on the refractive index distribution and a gain coupling constant $\kappa g$ indicating a degree of a distributed feedback based on the gain distribution:

$\Omega[\text{rad}] = \pi + 5.7 \cdot R - 2.6 \cdot R^2$ $R = \kappa g / (\kappa g^2 + \kappa i^2)^{1/2}$ $0 < R < 1$.

11. A distributed feedback semiconductor laser diode according to claim 8, wherein the laser device structure is configured so that a phase of the periodical change of the refractive index and a phase of the periodical change of the gain in the guiding direction of the stimulated emission light are opposite to each other, and the phase shift at the phase discontinuous section is set to be greater than 0 [rad] but less than $\pi$ [rad].

12. A distributed feedback semiconductor laser diode according to claim 11, wherein the phase shift $\Omega$ at the phase discontinuous section is set so that three expressions below are generally satisfied based on a refractive index coupling constant $\kappa i$ indicating a degree of a distributed feedback based on the refractive index distribution and a gain coupling constant $\kappa g$ indicating a degree of a distributed feedback based on the gain distribution:

$\Omega[\text{rad}] = \pi - 5.7 \cdot R + 2.6 \cdot R^2$ $R = \kappa g / (\kappa g^2 + \kappa i^2)^{1/2}$ $0 < R < 1$.

13. A distributed feedback semiconductor laser diode according to claim 8, wherein the phase shift $\Omega$ at the phase discontinuous section is set so that a refractive index coupling constant $\kappa i$ indicating a degree of a distributed feedback based on the refractive index distribution and a gain coupling constant $\kappa g$ indicating a degree of a distributed feedback based on the gain distribution generally satisfy two expressions below:

$0.3 \leq R < 1$ $R = \kappa g / (\kappa g^2 + \kappa i^2)^{1/2}$.

14. A distributed feedback semiconductor laser diode according to claim 8, wherein:

the laser device structure is configured so that substantial light reflection does not occur at either one of laser emission end faces of the laser device structure; and the phase shift $\Omega$ at the phase discontinuous section is set so that a refractive index coupling constant $\kappa i$ indicating a degree of a distributed feedback based on the refractive index distribution and a gain coupling constant $\kappa g$ indicating a degree of a distributed feedback based on the gain distribution generally satisfy two expressions below:

$0 < R < 0.3$ $R = \kappa g / (\kappa g^2 + \kappa i^2)^{1/2}$.

15. A method for producing a distributed feedback semiconductor laser diode, comprising the step of:

forming a laser device structure having a refractive index distribution and a gain distribution where a refractive index and a gain for stimulated emission light generated in an active layer each exhibit a periodical change at an identical single period in a guiding direction of the stimulated emission light, the laser device structure being configured so that the stimulated emission light is subject to an optical distributed feedback due to the periodical changes of the refractive index and the gain, thereby realizing laser oscillation, wherein:

the step of forming the laser device structure includes a step of forming a diffraction grating, including a phase discontinuous section, for generating the periodical changes of the refractive index and the gain for the stimulated emission light; and a phase shift at the phase discontinuous section being within a range greater than 0 (rad) but less than $\pi$ (rad), or within a range greater than $\pi$ (rad) but less than $2\pi$ (rad) and set so as to maximize a side mode suppression ratio, which is a ratio of a second highest output to a highest output.

16. A method for producing a distributed feedback semiconductor laser diode according to claim 15, wherein the phase shift at the phase discontinuous section is set based on a maximum value of the side mode suppression ratio, which is determined by a ratio of a refractive index coupling constant indicating a degree of a distributed feedback based on the refractive index distribution and a gain coupling constant indicating a degree of a distributed feedback based on the gain distribution.

* * * * *